(12) United States Patent
Watanabe et al.

(10) Patent No.: US 10,177,004 B2
(45) Date of Patent: Jan. 8, 2019

(54) METHOD OF PROCESSING WAFER

(71) Applicant: DISCO CORPORATION, Tokyo (JP)

(72) Inventors: Yoshio Watanabe, Tokyo (JP); Siry Milan, Tokyo (JP); Kenji Okazaki, Tokyo (JP); Hiroyuki Takahashi, Tokyo (JP); Yoshiteru Nishida, Tokyo (JP); Satoshi Kumazawa, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/922,086

(22) Filed: Mar. 15, 2018

(65) Prior Publication Data

US 2018/0269068 A1    Sep. 20, 2018

(30) Foreign Application Priority Data

Mar. 15, 2017    (JP) .................................. 2017-050064

(51) Int. Cl.
| | |
|---|---|
| *H01L 21/3065* | (2006.01) |
| *H01L 21/78* | (2006.01) |
| *H01L 21/223* | (2006.01) |
| *H01L 21/02* | (2006.01) |
| *H01J 37/32* | (2006.01) |

(52) U.S. Cl.
CPC ...... *H01L 21/3065* (2013.01); *H01L 21/0234* (2013.01); *H01L 21/02315* (2013.01); *H01L 21/2236* (2013.01); *H01L 21/78* (2013.01); *H01J 37/32449* (2013.01); *H01J 37/32577* (2013.01)

(58) Field of Classification Search
CPC ........... H01L 21/02315; H01L 21/0234; H01L 21/2236; H01L 21/268; H01L 21/428; H01L 24/95

USPC ...................... 216/65, 71; 438/727, 729, 730
See application file for complete search history.

(56) References Cited

U.S. PATENT DOCUMENTS

| | | | | |
|---|---|---|---|---|
| 7,678,670 | B2 * | 3/2010 | Arita ................... | H01L 21/6835 257/E21.523 |
| 2013/0065378 | A1 * | 3/2013 | Johnson .............. | H01L 21/3065 438/460 |
| 2013/0189830 | A1 * | 7/2013 | Hirschler ............. | H01L 21/6835 438/464 |
| 2014/0015109 | A1 * | 1/2014 | Lei .......................... | H01L 21/78 257/618 |
| 2014/0213041 | A1 * | 7/2014 | Lei .......................... | H01L 21/78 438/462 |
| 2014/0248757 | A1 * | 9/2014 | Morikazu ............... | H01L 21/78 438/463 |
| 2014/0273401 | A1 * | 9/2014 | Lei .................... | H01L 21/30655 438/462 |
| 2016/0307851 | A1 * | 10/2016 | Ohura ..................... | H01L 21/78 |
| 2016/0365283 | A1 * | 12/2016 | Lei .......................... | H01L 21/82 |

FOREIGN PATENT DOCUMENTS

JP    2000353676 A    12/2000

* cited by examiner

*Primary Examiner* — Binh X Tran
(74) *Attorney, Agent, or Firm* — Greer Burns & Crain Ltd.

(57) ABSTRACT

A method of processing a wafer includes a plasma etching step of supplying an etching gas in a plasma state to the wafer to remove processing strains, debris, or modified layers. The plasma etching step includes turning an etching gas into a plasma state outside of a vacuum chamber which houses the wafer therein and delivering the etching gas in the plasma state into the vacuum chamber through a supply nozzle connected to the vacuum chamber.

6 Claims, 14 Drawing Sheets

METHOD OF PROCESSING WAFER

BACKGROUND OF THE INVENTION

Field of the Invention

The present invention relates to a method of processing a wafer using a gas in a plasma state.

Description of the Related Art

Electronic devices, typically mobile phones and personal computers, incorporate, as indispensable components, device chips that have devices such as electronic circuits, etc. thereon. A device chip is manufactured by demarcating the face side of a wafer made of a semiconductor material such as silicon or the like into a plurality of areas with a plurality of projected dicing lines also known as streets, forming devices in the respective areas, and then dividing the wafer into device chips corresponding to the devices along the projected dicing lines.

In recent years, wafers with devices formed thereon have often been thinned by a grinding process or the like for the purpose of reducing the size and weight of device chips to be fabricated from the wafers. However, if a wafer is thinned by a grinding process, the flexural strength of device chips produced from the wafer is lowered on account of strains, hereinafter referred to as "processing strains," caused by the grinding process which are left on the ground surface of the wafer. One solution is to remove processing strains from the wafer in a plasma etching process which uses a gas in a plasma state after the wafer has been ground (see, for example, Japanese Patent Laid-Open No. 2000-353676).

A plasma etching apparatus that is used to remove processing strains from ground wafers usually has a vacuum chamber that houses therein a pair of electrodes in the form of flat plates which are parallel to each other. With a ground wafer placed between the electrodes, the vacuum chamber is evacuated and depressurized, and while the vacuum chamber is being supplied with an etching gas, a high-frequency voltage is applied between the electrodes to bring the gas into a plasma state. The gas in the plasma state is caused to act on the ground surface of the wafer to remove processing strains from the wafer.

SUMMARY OF THE INVENTION

The plasma etching process referred to above is considered also effective to remove processing strains that may be developed in wafers by processes other than the grinding process. Specifically, for example, the removal of processing strains or debris also referred to as processing chips produced on wafers when they are processed using a cutting blade including abrasive grains or an absorptive laser beam, and the removal of modified layers generated in wafers by focusing a transmissive laser beam therein, may be thought of as applications of the plasma etching process.

According to the conventional method of etching a wafer in a gas that is turned into a plasma state using a pair of electrodes in the form of parallel flat plates, however, etching progresses chiefly on one surface of the wafer which tends to be more exposed to the gas. It is difficult with this method to remove processing strains, debris, modified layers, or the like from deep positions in the wafer that are spaced from the one surface thereof without excessive etching progressing on the one surface of the wafer. In other words, this method is unable to appropriately remove processing strains, debris, modified layers, or the like that are present inside of grooves that have been formed in the wafer by processing the wafer.

It is therefore an object of the present invention to provide a method of processing a wafer to remove processing strains, debris, modified layers, or the like from deep positions in the wafer that are spaced from one surface thereof without excessive etching progressing on the one surface of the wafer.

In accordance with an aspect of the present invention, there is provided a method of processing a wafer on which devices are formed in a plurality of areas demarcated on a face side thereof by a plurality of projected dicing lines arranged in a grid pattern, the method including a protective film applying step of applying a protective film to the face side of the wafer; a processed groove forming step of forming processed grooves in the wafer from the face side thereof along the projected dicing lines; a plasma etching step of supplying an etching gas in a plasma state to the wafer from the face side thereof to remove processing strains or debris remaining in the processed grooves; and a protective film removing step of removing the protective film from the wafer, in which the plasma etching step includes turning an etching gas into a plasma state outside of a vacuum chamber which houses the wafer therein, and delivering the etching gas in the plasma state into the vacuum chamber through a supply nozzle connected to the vacuum chamber.

In the above aspect of the present invention, the processed groove forming step may include applying a laser beam having a wavelength that is absorbable by the wafer to the wafer to form processed grooves in the wafer.

In the above aspect of the present invention, the processed groove forming step may include causing a cutting blade to cut into the wafer to form processed grooves in the wafer.

In accordance with another aspect of the present invention, there is provided a method of processing a wafer on which devices are formed in a plurality of areas demarcated on a face side thereof by a plurality of projected dicing lines arranged in a grid pattern, the method including a cut groove forming step of causing a cutting blade to cut into the wafer from a reverse side thereof along the projected dicing lines to form cut grooves in the wafer to a depth short of the face side of the wafer; a dividing step of applying a laser beam to the bottoms of the cut grooves from the reverse side of the wafer to divide the wafer into device chips corresponding to the respective devices; and a plasma etching step of supplying an etching gas in a plasma state to the wafer from the reverse side thereof to remove processing strains or debris remaining on the device chips, in which the plasma etching step includes turning an etching gas into a plasma state outside of a vacuum chamber which houses the wafer therein, and delivering the etching gas in the plasma state into the vacuum chamber through a supply nozzle connected to the vacuum chamber.

In accordance with still another aspect of the present invention, there is provided a method of processing a wafer on which devices are formed in a plurality of areas demarcated on a face side thereof by a plurality of projected dicing lines arranged in a grid pattern, the method including a dividing step of applying a laser beam having a wavelength that is transmittable through the wafer to the wafer from a reverse side thereof along the projected dicing lines while focusing the laser beam at positions in the wafer, thereby forming modified layers in the wafer and developing cracks extending from the modified layers to the face side or the reverse side of the wafer, whereby the wafer is divided into device chips corresponding to the respective devices; and a plasma etching step of supplying an etching gas in a plasma state to the wafer from the reverse side thereof to remove the modified layers remaining on the device chips, in which the plasma etching step includes turning an etching gas into a plasma state outside of a vacuum chamber which houses the wafer therein, and delivering the etching gas in the plasma state into the vacuum chamber through a supply nozzle connected to the vacuum chamber.

In accordance with yet another aspect of the present invention, there is provided a method of processing a wafer on which devices are formed in a plurality of areas demarcated on a face side thereof by a plurality of projected dicing lines arranged in a grid pattern, the method including a dividing step of causing a cutting blade to cut into the wafer from a reverse side thereof along the projected dicing lines to divide the wafer into device chips corresponding to the respective devices; and a plasma etching step of supplying an etching gas in a plasma state to the wafer from the reverse side thereof to remove processing strains or debris remaining on the device chips, in which the plasma etching step includes turning an etching gas into a plasma state outside of a vacuum chamber which houses the wafer therein, and delivering the etching gas in the plasma state into the vacuum chamber through a supply nozzle connected to the vacuum chamber.

In the wafer processing methods according to the present invention, since an etching gas that has turned into a plasma state outside of the vacuum chamber which houses the wafer therein is delivered into the vacuum chamber in the plasma etching step of supplying the etching gas in the plasma state, processing strains, debris, modified layers, or the like that remain at positions spaced from one surface of the wafer can be removed without excessive etching progressing on the one surface of the wafer.

If ions are more prevalent than radicals in the etching gas in the plasma state, then etching progresses mainly on account of the ions on the one surface of the wafer which tends to be more exposed to the etching gas. In this case, therefore, it is difficult to remove processing strains, debris, modified layers, or the like that exist in positions spaced from the one surface of the wafer, i.e., in deep positions in the wafer, without excessive etching progressing on the one surface of the wafer.

According to the present invention, since the etching gas that has been turned into the plasma state outside of the vacuum chamber is delivered into the vacuum chamber, it is speculated that radicals are more prevalent than ions in the vacuum chamber. Therefore, the progress of etching by ions of the one surface of the wafer which tends to be more exposed to the etching gas is restrained, and the processing strains, debris, modified layers, or the like that remain in the positions spaced from the one surface of the wafer can be removed without excessive etching progressing on the one surface of the wafer.

The above and other objects, features and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE PREFERRED EMBODIMENTS

Embodiments of the present invention will be described below with reference to the accompanying drawings. Like or corresponding parts are denoted by like or corresponding reference symbols throughout views.

Embodiment 1

Figure 1:
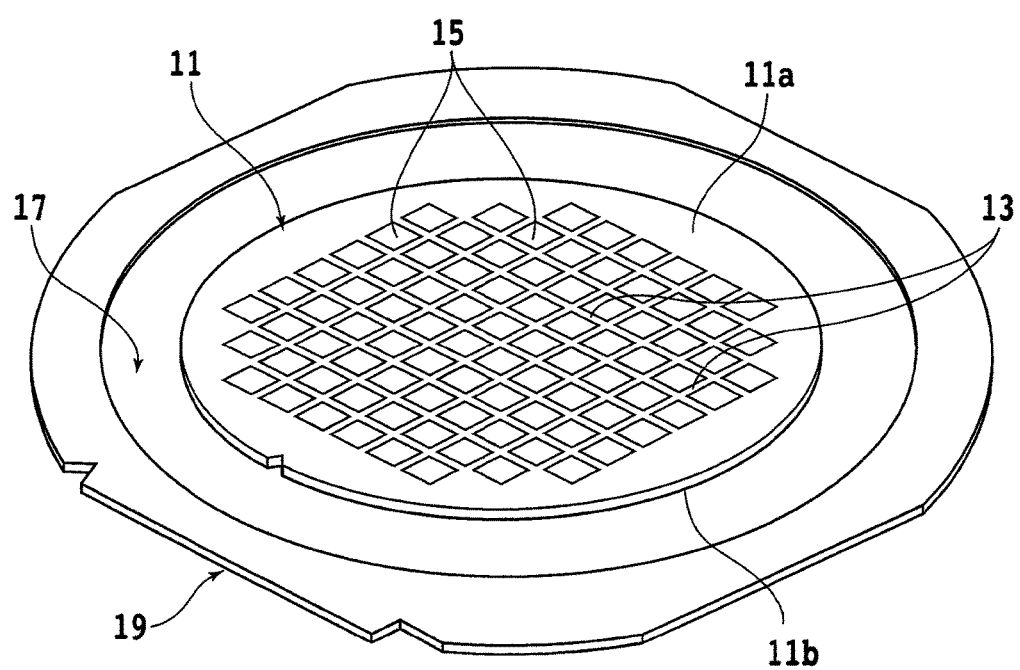
FIG. 1 is a perspective view schematically showing a wafer and other members by way of example.

A method of processing a wafer to form grooves (processed grooves) in the face side of a wafer after it has been coated with a protective film according to the present embodiment will be described below. FIG. 1 is a perspective view schematically showing a wafer 11 and other members by way of example, the wafer 11 being processed by the processing method according to the present embodiment. As shown in FIG. 1, the wafer 11 is of a disk shape and made of silicon (Si), silicon carbide (SiC), sapphire ($Al_2O_3$), or the like. The wafer 11 has a face side 11a demarcated into a plurality of areas by projected dicing lines or streets 13 arranged in a grid pattern. Devices 15 such as integrated circuits (ICs), light emitting diodes (LEDs), etc. are formed in the areas on the wafer 11.

According to the present embodiment, the wafer 11 is illustrated as being of a disk shape and made of silicon, silicon carbide, sapphire, or the like. However, the wafer 11 is not limited to particular materials, shapes, structures, sizes, etc. The wafer 11 may be made of other materials including a semiconductor, ceramics, resins, metals, etc. Similarly, the devices 15 are not limited to particular kinds, quantities, shapes, structures, sizes, layouts, etc.

The wafer 11 has a reverse side 11b to which a dicing tape 17 larger in diameter than the wafer 11 is stuck. The dicing tape 17 has an outer peripheral portion fixed to an annular frame 19. In other words, the wafer 11 is supported on the frame 19 through the dicing tape 17.

Figure 2A:
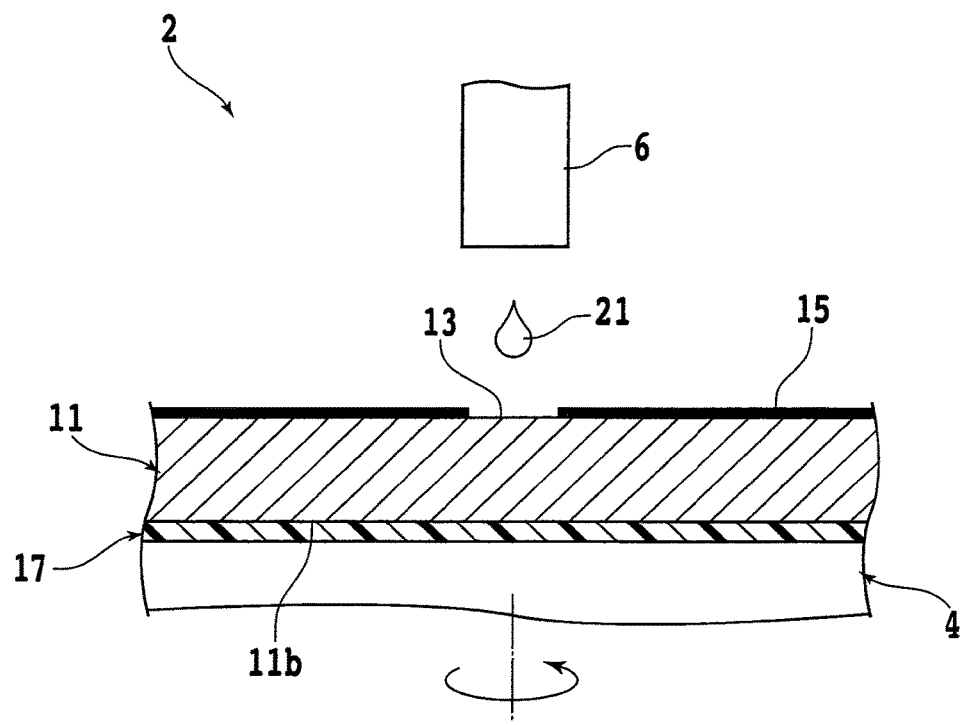
FIGS. 2A and 2B are fragmentary sectional side elevational views illustrative of a protective film applying step according to Embodiment 1.
Figure 2B:
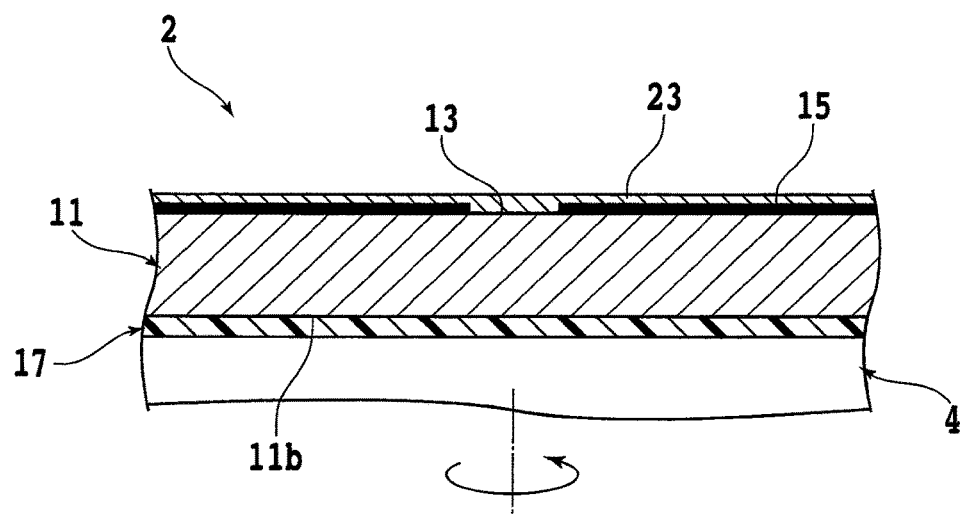

In the wafer processing method according to the present embodiment, a protective film applying step is carried out to coat the face side 11a of the wafer 11 with a protective film. FIGS. 2A and 2B are fragmentary sectional side elevational views illustrative of the protective film applying step. The protective film applying step according to the present embodiment is performed using a spin coater 2 shown in FIG. 2A, for example. As shown in FIG. 2A, the spin coater 2 includes a spinner table or holding table 4 for holding the wafer 11 thereon. The spinner table 4 is coupled to a rotary actuator, not shown, such as a motor, that rotates the spinner table 4 about its own axis substantially parallel to a vertical direction. The spinner table 4 has an upper surface part of which serves as a holding surface for holding the wafer 11 under suction thereon. The holding surface is connected to a suction source, not shown, through a suction channel, not shown, that is defined in the spinner table 4. The spin coater 2 also includes a nozzle 6 disposed above the spinner table 4 for dropping a liquid resin 21 as the material of the protective film. A plurality of clamps, not shown, for securing the annular frame 19 to the spinner table 4 are provided on an outer peripheral region of the spinner table 4.

In the protective film applying step, the dicing tape 17 that sticks to the reverse side 11b of the wafer 11 is held in contact with the holding surface of the spinner table 4, and a negative pressure from the suction source is caused to act on the dicing tape 17. At the same time, the frame 19 is secured to the spinner table 4 by the clamps. The wafer 11 is thus securely held on the spinner table 4 with the face side 11a being exposed upwardly. Then, as shown in FIG. 2A, the nozzle 6 drops the liquid resin 21 onto the face side 11a of the wafer 11, and the spinner table 4 is rotated about its own axis, coating the face side 11a of the wafer 11 with the liquid resin 21. Thereafter, the liquid resin 21 applied to the face side 11a is dried and hardened into a protective film 23 in covering relation to the devices 15, as shown in FIG. 2B.

Figure 3:
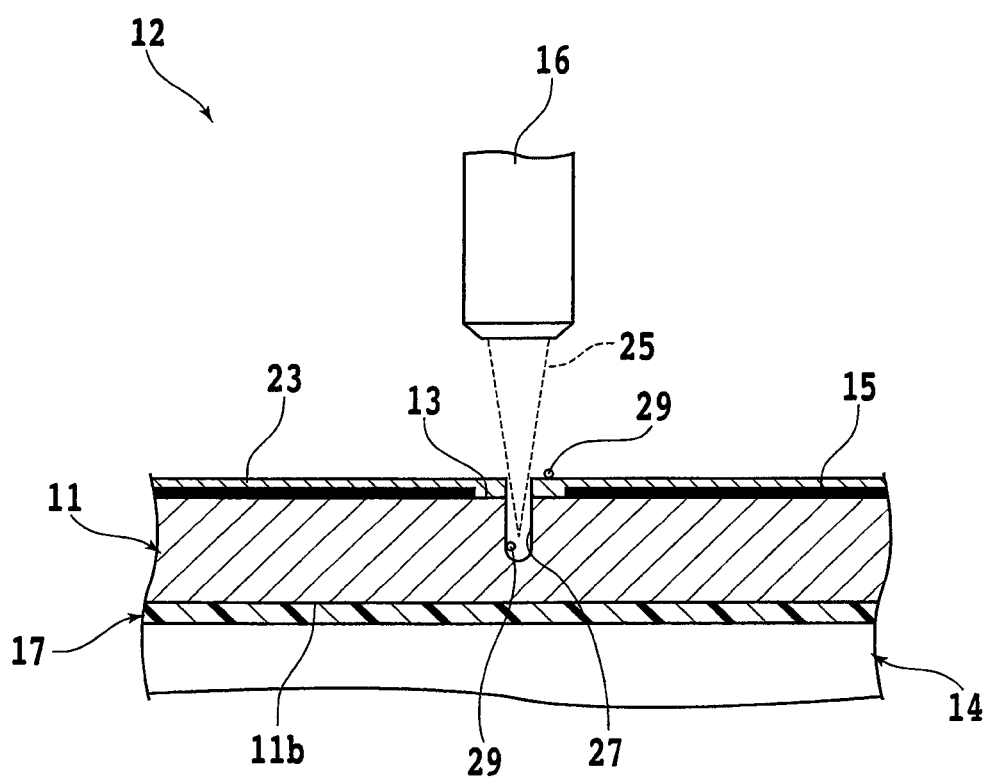
FIG. 3 is a fragmentary sectional side elevational view illustrative of a processed groove forming step according to Embodiment 1.

The protective film applying step is followed by a processed groove forming step that forms processed grooves in the face side 11a of the wafer 11 along the projected dicing lines 13. FIG. 3 is a fragmentary sectional side elevational view illustrative of the processed groove forming step according to the present embodiment. The processed groove forming step according to the present embodiment is performed using a laser processing apparatus 12 shown in FIG. 3, for example. As shown in FIG. 3, the laser processing apparatus 12 includes a chuck table or holding table 14 for holding the wafer 11 thereon. The chuck table 14 is coupled to a rotary actuator, not shown, such as a motor, that rotates the chuck table 14 about its own axis substantially parallel to a vertical direction. The chuck table 14 is disposed above a table moving mechanism, not shown, that moves the chuck table 14 in a processing-feed direction, i.e., a first horizontal direction, and an indexing-feed direction, i.e., a second horizontal direction.

The chuck table 14 has an upper surface part of which serves as a holding surface for holding the wafer 11 under suction thereon. The holding surface is connected to a suction source, not shown, through a suction channel, not shown, that is defined in the chuck table 14. A plurality of clamps, not shown, for securing the annular frame 19 to the chuck table 14 are provided on an outer peripheral region of the chuck table 14. The laser processing apparatus 12 also includes a laser irradiation unit 16 disposed above the chuck table 14. The laser irradiation unit 16 applies a pulsed laser beam 25 generated and emitted by a laser oscillator, not shown, and focuses the pulsed laser beam 25 at predetermined positions. Specifically, the laser oscillator is arranged to generate and emit a pulsed laser beam 25 having a wavelength that is to be absorbed by the wafer 11, for example, i.e., a wavelength that is absorbable by the wafer 11 or a wavelength that can easily be absorbed by the wafer 11.

In the processed groove forming step, the dicing tape 17 that sticks to the reverse side 11b of the wafer 11 is held in contact with the holding surface of the chuck table 14, and a negative pressure from the suction source is caused to act on the dicing tape 17. At the same time, the frame 19 is secured to the chuck table 14 by the clamps. The wafer 11 is thus securely held on the chuck table 14 with the protective film 23 on the face side 11a being exposed upwardly. Then, the chuck table 14 is turned about its own axis to bring one of the projected dicing lines 13 which is to be processed, i.e., a target projected dicing line 13, into alignment with the processing-feed direction of the laser processing apparatus 12. Furthermore, the chuck table 14 is moved to position the laser irradiation unit 16 into alignment with an extension of the target projected dicing line 13, for example.

Then, as shown in FIG. 3, while the pulsed laser beam 25 is being applied from the laser irradiation unit 16 to the face side 11a of the wafer 11, the chuck table 14 is moved in the processing-feed direction. The pulsed laser beam 25 is focused on the face side 11a of the wafer 11, for example. Conditions in which the pulsed laser beam 25 is applied, i.e., the power level, spot diameter, repetitive frequency, etc. of the pulsed laser beam 25, are adjusted in such a range that the pulsed laser beam 25 does not sever the wafer 11. In this manner, a processed groove 27 having a depth not large enough to sever the wafer 11 is formed in the wafer 11 along the target projected dicing line 13 by the pulsed laser beam 25 that has irradiated the wafer 11 therealong. The above process is repeated to form processed grooves 27 in the wafer 11 along all the projected dicing lines 13, whereupon the processed groove forming step is finished. In the processed groove forming step, debris or processing chips 29 and processing strains, not shown, are produced in the processed grooves 27 and nearby regions.

Figure 4:
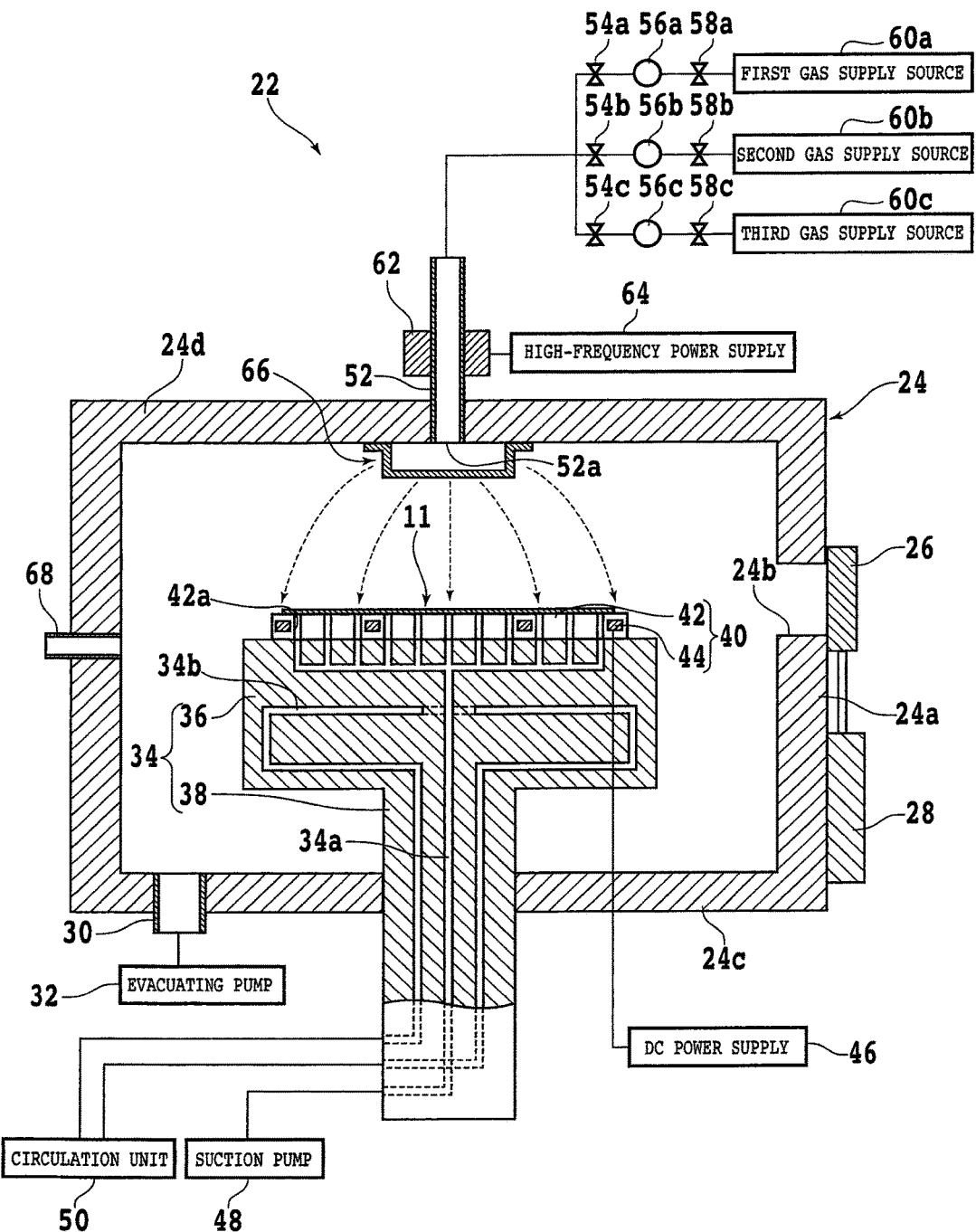
FIG. 4 is a cross-sectional view, partly in block form, schematically showing a plasma etching apparatus.

The processed groove forming step is followed by a plasma etching step that is carried out to remove the debris 29 and the processing strains that remain in the processed grooves 27 and nearby regions. FIG. 4 is a cross-sectional view, partly in block form, schematically showing a plasma etching apparatus 22 that is used in the plasma etching step according to the present embodiment. As shown in FIG. 4, the plasma etching apparatus 22 includes a vacuum chamber 24 having a processing space defined therein. The vacuum chamber 24 includes a side wall 24a having an opening 24b defined therein through which the wafer 11 can be loaded into and out of the processing space in the vacuum chamber 24. A gate 26 is mounted on an outer surface of the side wall 24a for selectively closing the opening 24b. The gate 26 is connected to an opening/closing unit 28 such as an air cylinder or the like disposed below the gate 26. The gate 26 is vertically movable by the opening/closing unit 28. When the gate 26 is lowered by the opening/closing unit 28, the opening 24b is exposed to allow the wafer 11 to be loaded into or out of the processing space therethrough.

The vacuum chamber 24 includes a bottom wall 24c that is connected to an evacuating pump 32 through a pipe 30. For processing the wafer 11 in the processing space, the opening/closing unit 28 moves the gate 26 upwardly to close the opening 24b. Thereafter, the evacuating pump 32 evacuates the processing space to depressurize the same. The processing space accommodates therein a table base 34 for supporting the wafer 11 thereon. The table base 34 includes a disk-shaped plate 36 and a columnar post 38 extending downwardly from the center of a lower surface of the disk-shaped plate 36.

A disk-shaped electrostatic chuck table 40 which is of a smaller diameter than the disk-shaped plate 36 is disposed on an upper surface of the disk-shaped plate 36. The electrostatic chuck table 40 includes a main table body 42 made of an insulative material and a plurality of electrodes 44 embedded in the main table body 42. The electrostatic chuck table 40 attracts and holds the wafer 11 thereon under electrostatic forces generated between the electrodes 44. Each of the electrodes 44 is electrically connected to a direct current (DC) power supply 46 that generates a high DC voltage of approximately 5 kV, for example. The main table body 42 of the electrostatic chuck table 40 has suction passageways 42a defined therein for transmitting suction forces therethrough to attract the wafer 11 under suction on the main table body 42. The suction passageways 42a are connected to a suction pump 48 through a suction channel 34a defined in the table base 34.

For holding the wafer 11 on the electrostatic chuck table 40, the wafer 11 is placed on the upper surface of the electrostatic chuck table 40, and the suction pump 48 is actuated. The wafer 11 is held in intimate contact with the upper surface of the electrostatic chuck table 40 under suction forces generated by the suction pump 48. Then, the DC power supply 46 applies the DC voltage to the electrodes 44, developing a potential difference between the electrodes 44 to attract and hold the wafer 11 on the upper surface of the electrostatic chuck table 40 under electrostatic forces.

The table base 34 has a coolant channel 34b defined therein. The coolant channel 34b has opposite ends connected to a circulation unit 50 that circulates a coolant through the coolant channel 34b. When the circulation unit 50 is actuated, the coolant flows through the coolant channel 34b from one end to other thereof, cooling the table base 34 and nearby parts.

The vacuum chamber 24 has an upper wall 24d connected to the downstream end of a gas supply nozzle 52 that supplies an etching gas in a plasma state to the wafer 11 held in position on the electrostatic chuck table 40. The supply nozzle 52 has an upstream end connected to a parallel array of gas supply sources for supplying different gases to the gas supply nozzle 52. Specifically, a first gas supply source 60a for supplying $SF_6$ is connected to the upstream end of the supply nozzle 52 through a valve 54a, a flow controller 56a, and a valve 58a. A second gas supply source 60b for supplying $O_2$ is connected to the upstream end of the supply nozzle 52 through a valve 54b, a flow controller 56b, and a valve 58b. A third gas supply source 60c for supplying an inactive gas is connected to the upstream end of the supply nozzle 52 through a valve 54c, a flow controller 56c, and a valve 58c. In this manner, an etching gas that includes a mixture of those different gases that are mixed at a desired ratio is supplied to the supply nozzle 52.

An electrode 62 for applying a high-frequency voltage to the etching gas flowing through the supply nozzle 52 is mounted on a middle portion of the supply nozzle 52 between its upstream and downstream ends. The electrode 62 is electrically connected to a high-frequency power supply 64. The electrode 62 and the high-frequency power supply 64 jointly make up a high-frequency voltage applying unit. The high-frequency power supply 64 supplies a high-frequency voltage in the range of 0.5 to 5 kV at a frequency ranging from 450 kHz to 2.45 GHz to the electrode 62. By applying the high-frequency voltage to the etching gas flowing through the supply nozzle 52 with the electrode 62 and the high-frequency power supply 64, the etching gas is turned into a plasma state in which ions and radicals exist. The etching gas in the plasma state is supplied to the processing space from a supply port 52a defined in the downstream end of the supply nozzle 52 and opening into the processing space. The number of gas supply sources and the kinds of gases supplied from the gas supply sources may be changed depending on the type of the wafer 11 to be processed. The rates at which the respective gases flow to the supply nozzle 52 are set to appropriate values insofar as the etching gas can be turned into a plasma state.

A diffuser 66 is mounted on an inner surface of the upper wall 24d around the supply port 52a where the supply nozzle 52 is connected to the vacuum chamber 24. The diffuser 66 diffuses the etching gas in the plasma state flowing from the supply nozzle 52 into the processing space in the vacuum chamber 24, above the electrostatic chuck table 40. A pipe 68 is mounted in the side wall 24a opposite the opening 24b and is open into the processing space. The pipe 68 is connected to the third gas supply source 60c, for example, through a valve, not shown, and a flow controller, not shown. The inactive gas that is supplied from the third gas supply source 60c via the pipe 68 serves as an inner gas that fills the processing space in the vacuum chamber 24.

In the plasma etching step, the gate 26 is initially lowered by the opening/closing unit 28, exposing the opening 24b. Then, the wafer 11 is loaded through the exposed opening 24b into the processing space in the vacuum chamber 24, and placed on the upper surface of the electrostatic chuck table 40 such that the protective film 23 covering the face side 11a of the wafer 11 is exposed upwardly. In other words, the dicing tape 17 that sticks to the reverse side 11b of the wafer 11 is held in contact with the upper surface of the electrostatic chuck table 40. At this time, the annular frame 19 may remain fixed to the outer peripheral portion of the dicing tape 17. Alternatively, the annular frame 19 may be removed if necessary.

Thereafter, the suction pump 48 is actuated to hold the wafer 11, i.e., the dicing tape 17 thereon, in intimate contact with the electrostatic chuck table 40. The DC power supply 46 applies the DC voltage to the electrodes 44, developing a potential difference between the electrodes 44 to attract and hold the wafer 11 on the upper surface of the electrostatic chuck table 40 under electrostatic forces. The opening/closing unit 28 is actuated to lift the gate 26 to close the opening 24b, and the evacuating pump 32 is actuated to evacuate the processing space to depressurize the same. After the processing space has been depressurized to approximately 200 Pa, for example, the processing space is filled with the inner gas supplied as the inactive gas supplied from the third gas supply source 60c through the pipe 68. The inner gas that fills the processing space may be a rare gas such as Ar, He, or the like, or a mixture gas including a rare gas that is mixed with $N_2$, $H_2$, or the like.

After the processing space has been filled with the inactive gas, the first gas supply source 60a, the second gas supply source 60b, and the third gas supply source 60c supply $SF_6$, $O_2$, and the inactive gas, respectively, to the gas supply nozzle 52 at respective rates. The high-frequency power supply 64 applies the high-frequency voltage to the electrode 62, turning the mixture of $SF_6$, $O_2$, and the inactive gas as it flows through the gas supply nozzle 52 into a plasma state including ions and radicals. The gas supply nozzle 52 now supplies the mixture gas in the plasma state through the supply port 52a to the processing space in the vacuum chamber 24. When the mixture gas in the plasma state flows through the diffuser 66 disposed below the supply port 52a, the mixture gas in the plasma state is diffused by the diffuser 66, and is supplied to the face side 11a of the wafer 11 attracted and held on the electrostatic chuck table 40.

Figure 5:
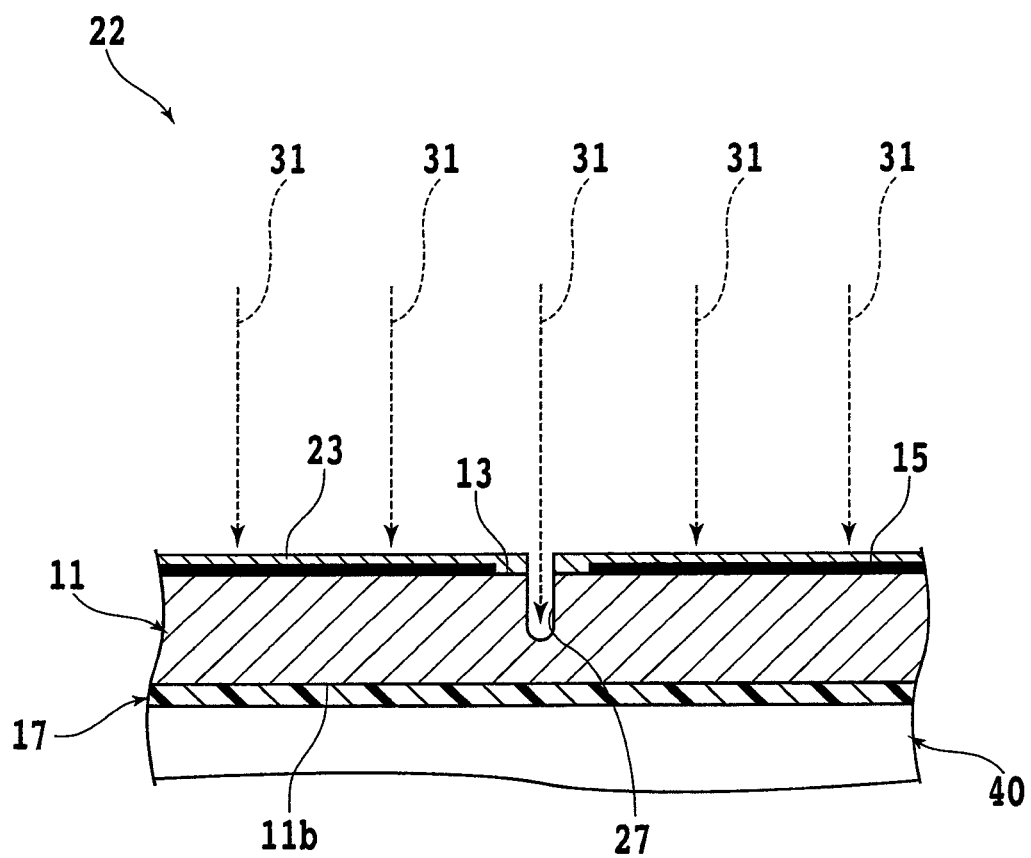
FIG. 5 is a fragmentary sectional side elevational view illustrative of a plasma etching step according to Embodiment 1.

FIG. 5 is a fragmentary sectional side elevational view illustrative of the manner in which the mixture gas, also referred to as "etching gas," denoted by 31, in the plasma state is supplied to the face side 11a of the wafer 11 in the plasma etching step. According to the present embodiment, since the mixture gas 31 that has been turned into the plasma state outside of the vacuum chamber 24 is delivered through the supply nozzle 52 into the vacuum chamber 24, it is speculated that most of the highly reactive ions in the mixture gas 31 are lost before being introduced into the vacuum chamber 24, and radicals are more prevalent than ions within the processing space in the vacuum chamber 24. Therefore, the progress of etching by ions of the face side 11a (one surface) of the wafer 11 is restrained, and the debris 29 and the processing strains that remain in the processed grooves 27 and nearby regions can appropriately be removed without excessive etching progressing on the face side 11a of the wafer 11, as shown in FIG. 5.

After the plasma etching step, a protective film removing step is carried out to remove the protective film 23 from the face side 11a of the wafer 11. In the protective film removing step, the protective film 23 is removed from the face side 11a of the wafer 11 by aqueous dissolution, peeling, ashing, or the like, for example. Those removing processes are illustrative only, and the protective film 23 may be removed by other suitable removing processes.

In the wafer processing method according to the present embodiment, as described above, since the mixture gas 31 that has been turned into the plasma state outside of the vacuum chamber 24 that houses the wafer 11 therein is delivered through the supply nozzle 52 into the vacuum chamber 24 in the plasma etching step, the debris 29 and the processing strains that remain in positions spaced from the face side 11a (one surface) of the wafer 11 can be removed without excessive etching progressing on the face side 11a of the wafer 11.

Figure 6:
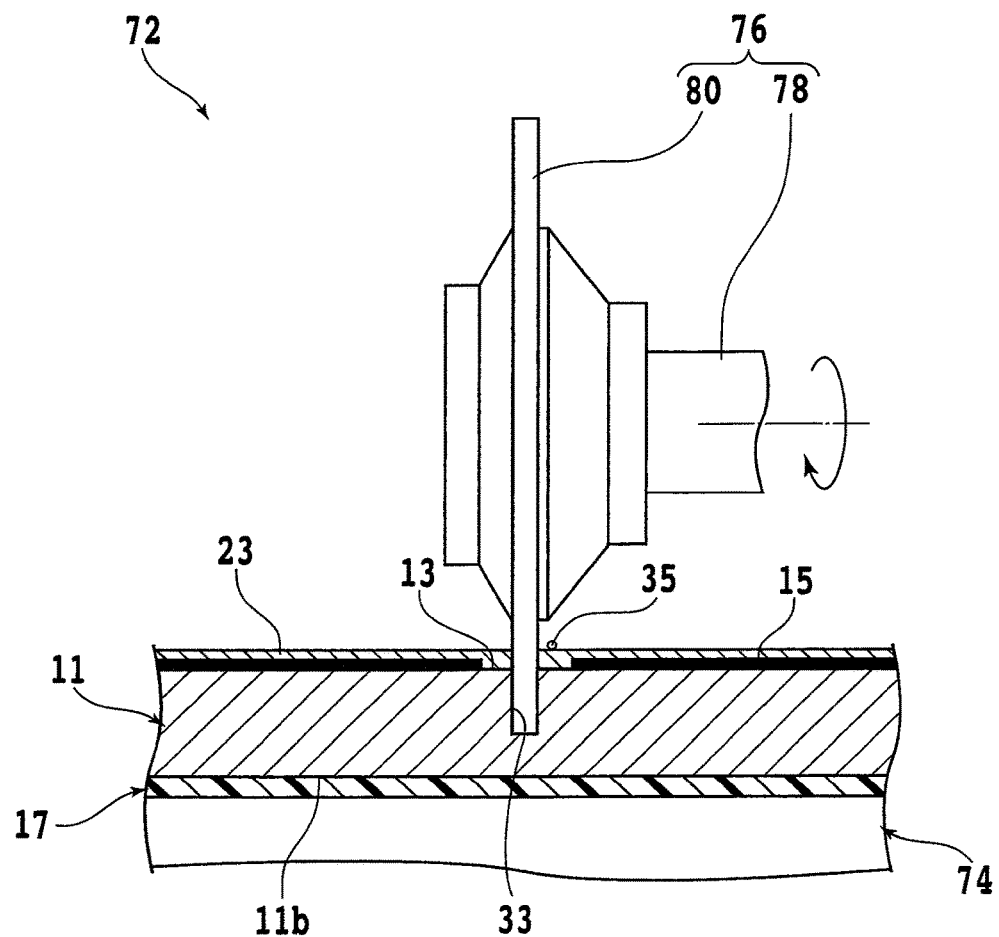
FIG. 6 is a fragmentary sectional side elevational view illustrative of a processed groove forming step according to a modification.

In the processed groove forming step according to the present embodiment, the processed grooves 27 are formed in the wafer 11 by applying the pulsed laser beam 25 to the face side 11a of the wafer 11. However, processed grooves may be formed in the wafer 11 by other processes. FIG. 6 is a fragmentary sectional side elevational view illustrative of a processed groove forming step according to a modification. The processed groove forming step according to the modification is performed using a cutting apparatus 72 shown in FIG. 6, for example. As shown in FIG. 6, the cutting apparatus 72 includes a chuck table or holding table 74 for holding the wafer 11 thereon. The chuck table 74 is coupled to a rotary actuator, not shown, such as a motor, that rotates the chuck table 74 about its own axis substantially parallel to a vertical direction. The chuck table 74 is disposed above a table moving mechanism, not shown, that moves the chuck table 74 in a processing-feed direction, i.e., a first horizontal direction. The chuck table 74 has an upper surface part of which serves as a holding surface for holding the wafer 11 under suction thereon. The holding surface is connected to a suction source, not shown, through a suction channel, not shown, that is defined in the chuck table 74. A plurality of clamps, not shown, for securing the annular frame 19 to the chuck table 74 are provided on an outer peripheral region of the chuck table 74.

The cutting apparatus 72 includes a cutting unit 76 disposed above the chuck table 74. The cutting unit 76 has a spindle 78 rotatable about its own axis that extends substantially perpendicular to the processing-feed direction. The spindle 78 supports on one end thereof an annular cutting blade 80 that is made of a binder with abrasive grains dispersed therein. A nozzle, not shown, for supplying a cutting fluid to the wafer 11 and the cutting blade 80 is disposed in the vicinity of the cutting blade 80. The other end of the spindle 78 is coupled to a rotary actuator, not shown, such as a motor. The cutting blade 80 mounted on the one end of the spindle 78 is rotatable about its own axis by rotational forces transmitted from the rotary actuator. The cutting unit 76 is supported by a cutting unit moving mechanism, not shown, which moves the cutting unit 76 in an indexing-feed direction, i.e., a second horizontal direction, and a vertical direction.

In the processed groove forming step according to the modification, the dicing tape 17 that sticks to the reverse side 11b of the wafer 11 is held in contact with the holding surface of the chuck table 74, and a negative pressure from the suction source is caused to act on the dicing tape 17. At the same time, the frame 19 is secured to the chuck table 74 by the clamps. The wafer 11 is thus securely held on the chuck table 74 with the protective film 23 on the face side 11a being exposed upwardly. Then, the chuck table 74 is turned about its own axis to bring a target projected dicing line 13 into alignment with the processing-feed direction of the cutting apparatus 72. The chuck table 74 and the cutting unit 76 are moved relatively to each other to position the plane of the cutting blade 80 into alignment with an extension of the target projected dicing line 13. The lower end of the cutting blade 80 is moved to a vertical position lower than the face side 11a of the wafer 11, but higher than the reverse side 11b thereof.

Thereafter, while the cutting blade 80 is being rotated, the chuck table 74 is moved in the processing-feed direction. At the same time, the nozzle supplies a cutting fluid to the wafer 11 and the cutting blade 80. The cutting blade 80 cuts into the wafer 11 along the target projected dicing line 13, forming a processed groove 33 in the wafer 11 to a depth not large enough to sever the wafer 11. The above process is repeated to form processed grooves 33 in the wafer 11 along all the projected dicing lines 13, whereupon the processed groove forming step according to the modification is finished. In the processed groove forming step, debris or processing chips 35 and processing strains, not shown, are produced in the processed grooves 33 and nearby regions.

Embodiment 2

Figure 7:
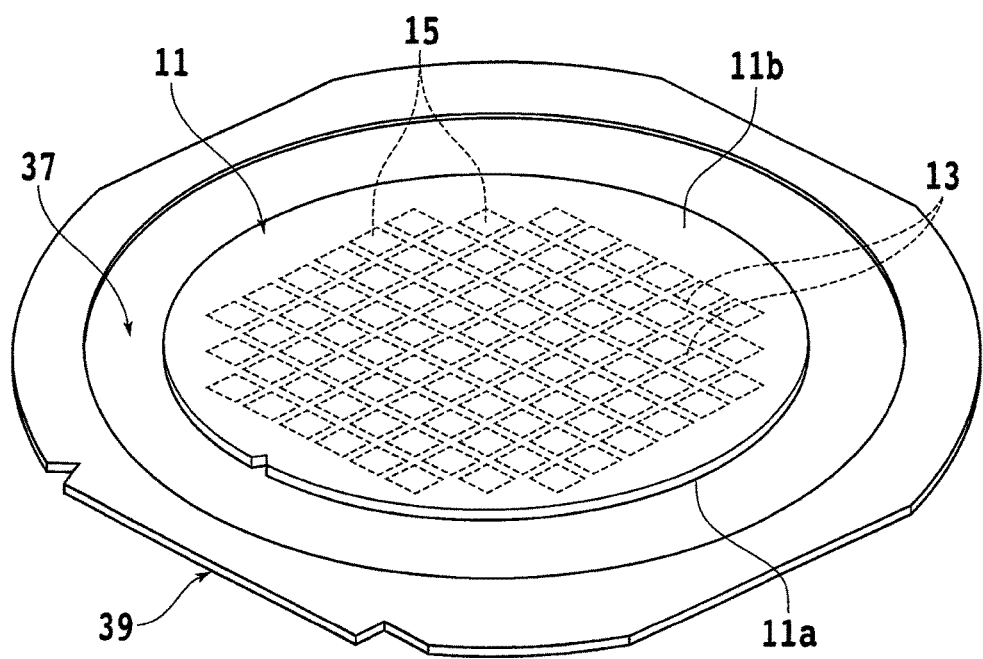
FIG. 7 is a perspective view schematically showing a wafer and other members by way of example.

A method of processing a wafer to divide the wafer with a laser beam applied to the bottoms of cut grooves that have been formed in a reverse side of the wafer according to the present embodiment will be described below. FIG. 7 is a perspective view schematically showing a wafer 11 and other members by way of example according to the present embodiment. The wafer 11 to be processed by the wafer processing method according to the present embodiment is identical to the wafer 11 according to Embodiment 1 described above. According to the present embodiment, as shown in FIG. 7, the wafer 11 has a face side 11a to which a dicing tape 37 larger in diameter than the wafer 11 is stuck. The dicing tape 37 has an outer peripheral portion fixed to an annular frame 39. In other words, the wafer 11 is supported on the frame 39 through the dicing tape 37.

Figure 8:
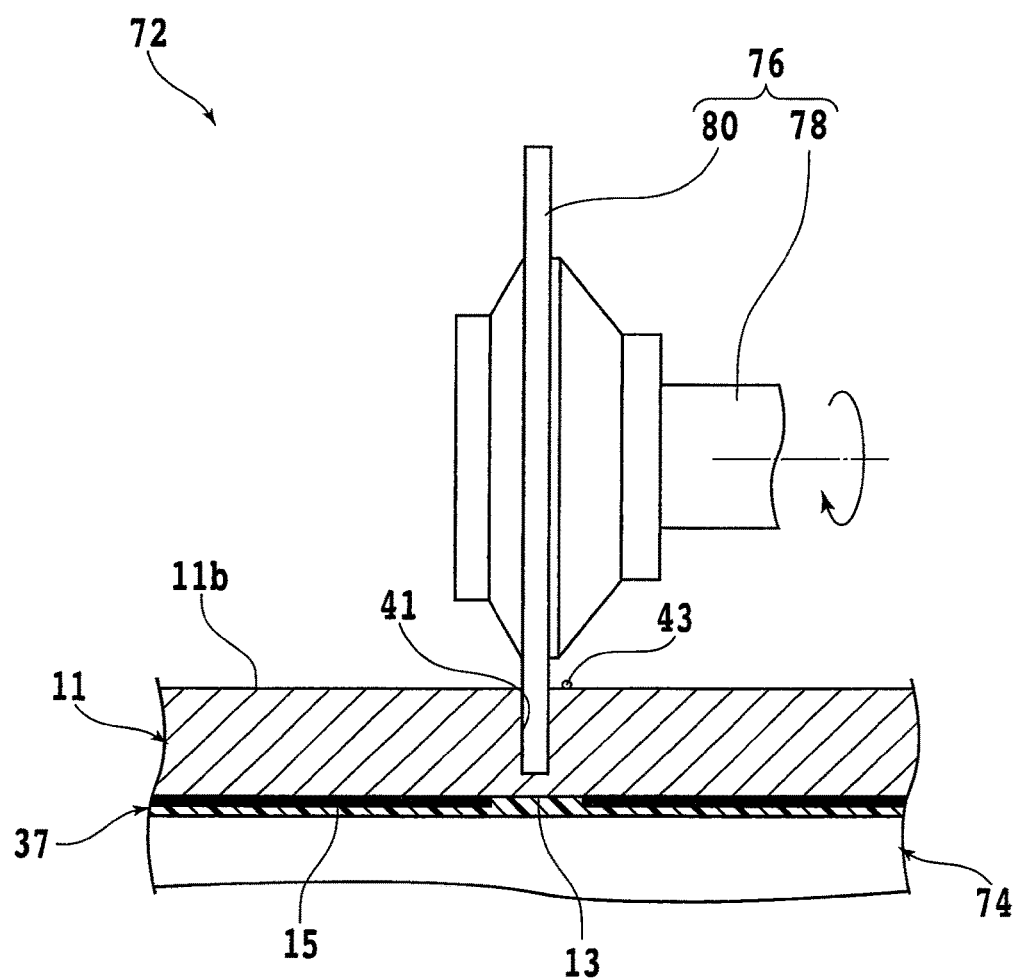
FIG. 8 is a fragmentary sectional side elevational view illustrative of a cut groove forming step according to Embodiment 2.

The wafer processing method according to the present embodiment begins with a cut groove forming step to form cut grooves in a reverse side 11b of the wafer 11 along the projected dicing lines 13. FIG. 8 is a fragmentary sectional side elevational view illustrative of the cut groove forming step. The cut groove forming step is performed using the cutting apparatus 72 described above, for example. In the cut groove forming step, the dicing tape 37 that sticks to the face side 11a of the wafer 11 is held in contact with the holding surface of the chuck table 74, and a negative pressure from the suction source is caused to act on the dicing tape 37. At the same time, the frame 39 is secured to the chuck table 74 by the clamps. The wafer 11 is thus securely held on the chuck table 74 with the reverse side 11b being exposed upwardly. Then, the chuck table 74 is turned about its own axis to bring a target projected dicing line 13 into alignment with the processing-feed direction of the cutting apparatus 72. The chuck table 74 and the cutting unit 76 are moved relatively to each other to position the plane of the cutting blade 80 into alignment with an extension of the target projected dicing line 13. The lower end of the cutting blade 80 is moved to a vertical position lower than the reverse side 11b of the wafer 11, but higher than the face side 11a thereof.

Thereafter, while the cutting blade 80 is being rotated, the chuck table 74 is moved in the processing-feed direction. At the same time, the nozzle supplies a cutting fluid to the wafer 11 and the cutting blade 80. The cutting blade 80 cuts into the wafer 11 along the target projected dicing line 13, forming a cut groove 41 in the wafer 11 to a depth short of the face side 11a, i.e., a depth not large enough to sever the wafer 11. The above process is repeated to form cut grooves 41 in the wafer 11 along all the projected dicing lines 13, whereupon the cut groove forming step is finished. In the cut groove forming step, debris or processing chips 43 and processing strains, not shown, are produced in the cut grooves 41 and nearby regions.

Figure 9:
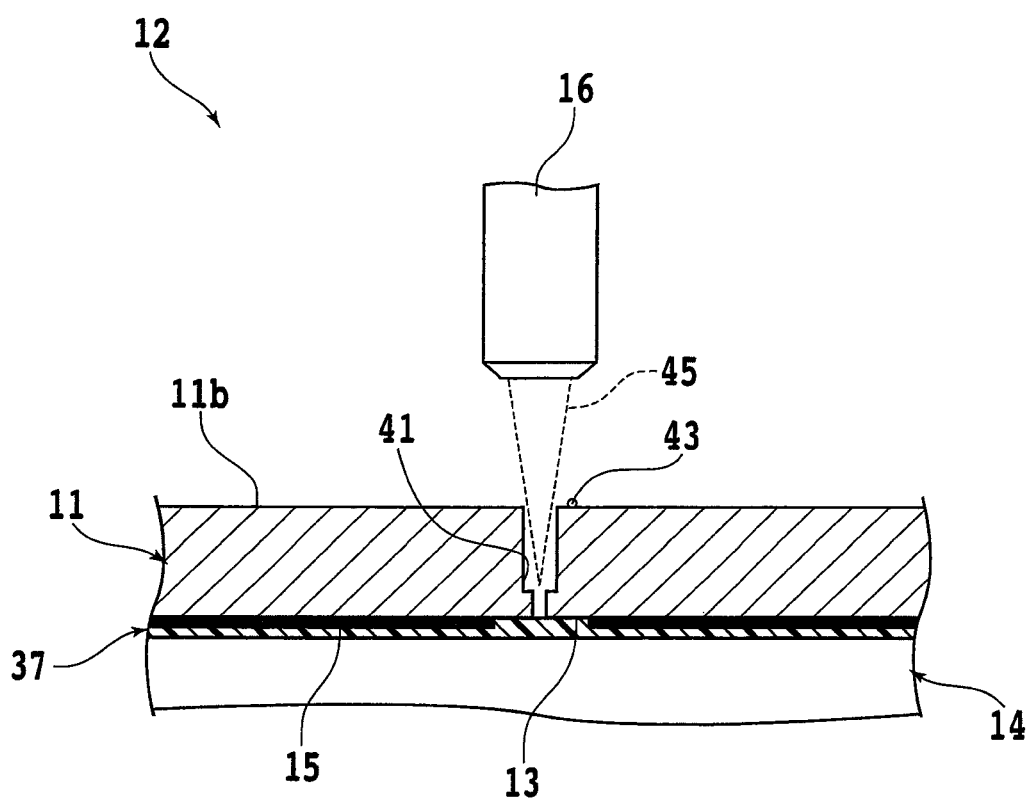
FIG. 9 is a fragmentary sectional side elevational view illustrative of a dividing step according to Embodiment 2.

The cut groove forming step is followed by a dividing step to divide the wafer 11 into individual devices 15 by applying a laser beam to the bottoms of the cut grooves 41. FIG. 9 is a fragmentary sectional side elevational view illustrative of the dividing step. The dividing step is performed using the laser processing apparatus 12 described above, for example. In the dividing step, the dicing tape 37 that sticks to the face side 11a of the wafer 11 is held in contact with the holding surface of the chuck table 14, and a negative pressure from the suction source is caused to act on the dicing tape 37. At the same time, the frame 39 is secured to the chuck table 14 by the clamps. The wafer 11 is thus securely held on the chuck table 14 with the reverse side 11b being exposed upwardly. Then, the chuck table 14 is turned about its own axis to bring a target cut groove 41 into alignment with the processing-feed direction of the laser processing apparatus 12. Furthermore, the chuck table 14 is moved to position the laser irradiation unit 16 into alignment with an extension of the target cut groove 41, for example.

Then, as shown in FIG. 9, while a pulsed laser beam 45 is being applied from the laser irradiation unit 16 to the reverse side 11b of the wafer 11, the chuck table 14 is moved in the processing-feed direction. The pulsed laser beam 45 is focused on the bottom of the target cut groove 41, for example. Conditions in which the pulsed laser beam 45 is applied, i.e., the power level, spot diameter, repetitive frequency, etc. of the pulsed laser beam 45, are adjusted in such a range that the pulsed laser beam 45 severs the wafer 11 at the bottom of the cut groove 41. In this manner, the laser beam 45 is applied to the wafer 11 along the cut groove 41, i.e., the projected dicing line 13, thereby severing the wafer 11. The above process is repeated to sever the wafer 11 along all the projected dicing lines 13, forming device chips corresponding to the respective devices 15, whereupon the dividing step is finished. In the dividing step, debris 43 and processing strains, not shown, are produced in the cut grooves 41 and nearby regions. In other words, debris 43 and processing strains that are produced in the cut groove forming step or the dividing step remain on each of the device chips.

Figure 10:
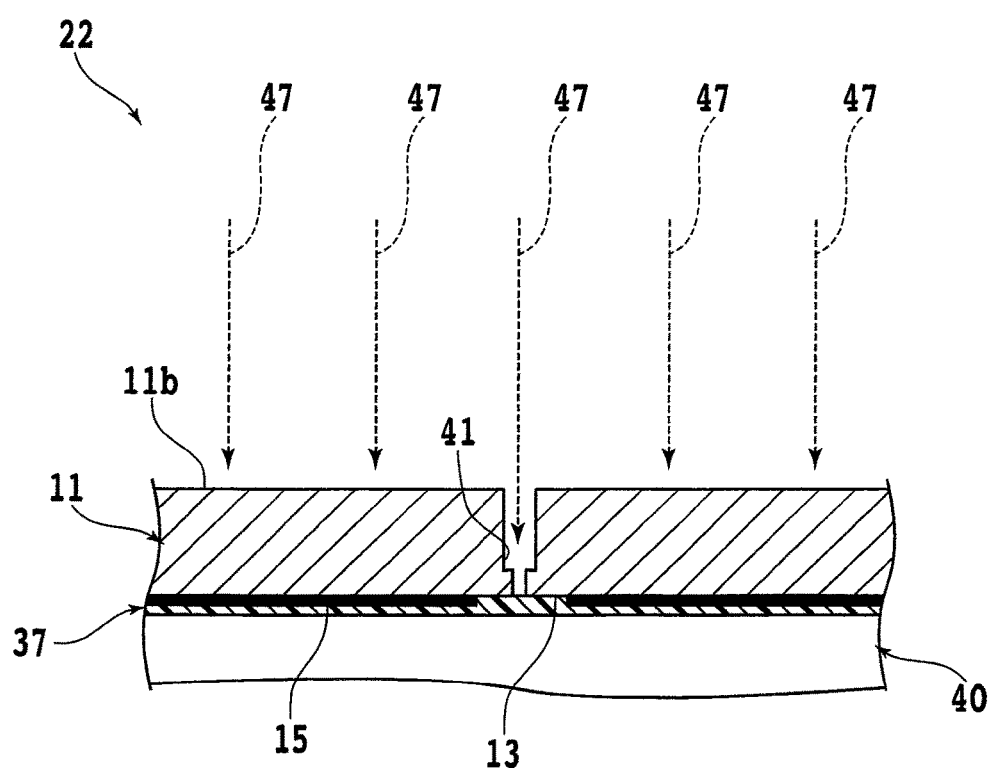
FIG. 10 is a fragmentary sectional side elevational view illustrative of a plasma etching step according to Embodiment 2.

The dividing step is followed by a plasma etching step to remove the debris 43 and processing strains that remain on each of the device chips. FIG. 10 is a fragmentary sectional side elevational view illustrative of the plasma etching step. The plasma etching step according to the present embodiment is performed using the plasma etching apparatus 22 described above. Specific procedure details of the plasma etching step are the same as those of the plasma etching step according to Embodiment 1.

In the plasma etching step according to the present embodiment, the gate 26 is initially lowered by the opening/closing unit 28, exposing the opening 24b. Then, the wafer 11 is loaded through the exposed opening 24b into the processing space in the vacuum chamber 24, and placed on the upper surface of the electrostatic chuck table 40 such that the reverse side 11b of the wafer 11 is exposed upwardly. In other words, the dicing tape 37 that sticks to the face side 11a of the wafer 11 is held in contact with the upper surface of the electrostatic chuck table 40. At this time, the annular frame 39 may remain fixed to the outer peripheral portion of the dicing tape 37. Alternatively, the annular frame 39 may be removed if necessary.

Thereafter, the suction pump 48 is actuated to hold the wafer 11, i.e., the dicing tape 37 thereon, in intimate contact with the electrostatic chuck table 40. The DC power supply 46 applies the DC voltage to the electrodes 44, developing a potential difference between the electrodes 44 to attract and hold the wafer 11 on the upper surface of the electrostatic chuck table 40 under electrostatic forces. The opening/closing unit 28 is actuated to lift the gate 26 to close the opening 24b, and the evacuating pump 32 is actuated to evacuate the processing space to depressurize the same. After the processing space has been depressurized to approximately 200 Pa, for example, the processing space is filled with the inner gas supplied as the inactive gas supplied from the third gas supply source 60c through the pipe 68. The inner gas that fills the processing space may be a rare gas such as Ar, He, or the like, or a mixture gas including a rare gas that is mixed with $N_2$, $H_2$, or the like.

After the processing space has been filled with the inactive gas, the first gas supply source 60a, the second gas supply source 60b, and the third gas supply source 60c supply $SF_6$, $O_2$, and the inactive gas, respectively, to the gas supply nozzle 52 at respective rates. The high-frequency power supply 64 applies the high-frequency voltage to the electrode 62, turning the mixture of $SF_6$, $O_2$, and the inactive gas as it flows through the gas supply nozzle 52 into a plasma state including ions and radicals. The gas supply nozzle 52 now supplies the mixture gas, i.e., an etching gas, 47 in the plasma state through the supply port 52a to the processing space in the vacuum chamber 24. When the mixture gas 47 in the plasma state flows through the diffuser 66 disposed below the supply port 52a, the mixture gas 47 in the plasma state is diffused by the diffuser 66, and is supplied to the reverse side 11b of the wafer 11 attracted and held on the electrostatic chuck table 40.

According to the present embodiment, inasmuch as the mixture gas 47 that has been turned into the plasma state outside of the vacuum chamber 24 is delivered through the supply nozzle 52 into the vacuum chamber 24, it is speculated that most of the highly reactive ions in the mixture gas 47 are lost before being introduced into the vacuum chamber 24, and radicals are more prevalent than ions within the processing space in the vacuum chamber 24. Therefore, the progress of etching by ions of the reverse side 11b of the wafer 11 is restrained, and the debris 43 and the processing strains that remain on the device chips can appropriately be removed without excessive etching progressing on the reverse side 11b (one surface) of the wafer 11, as shown in FIG. 10.

Embodiment 3

A method of processing a wafer to divide the wafer by forming modified layers and cracks therein along projected dicing lines according to the present embodiment will be described below. In the present embodiment, a wafer 11 which is identical to the wafer 11 according to Embodiment 2 is used. Stated otherwise, the dicing tape 37 sticks to the face side 11a of the wafer 11.

Figure 11A:
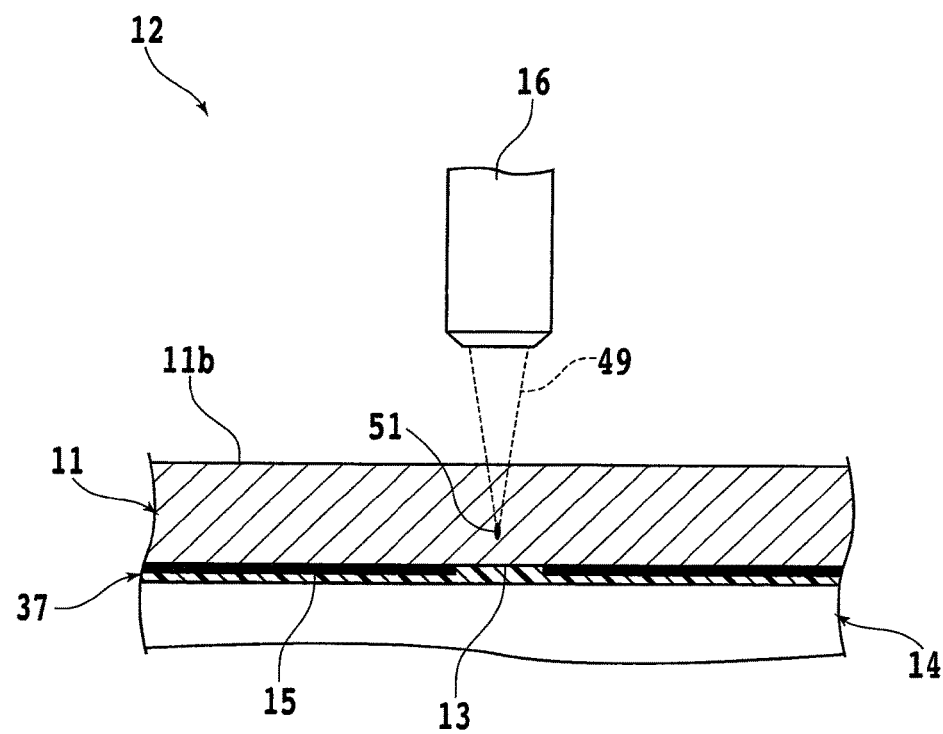
FIG. 11A is a fragmentary sectional side elevational view illustrative of a dividing step according to Embodiment 3.
Figure 11B:
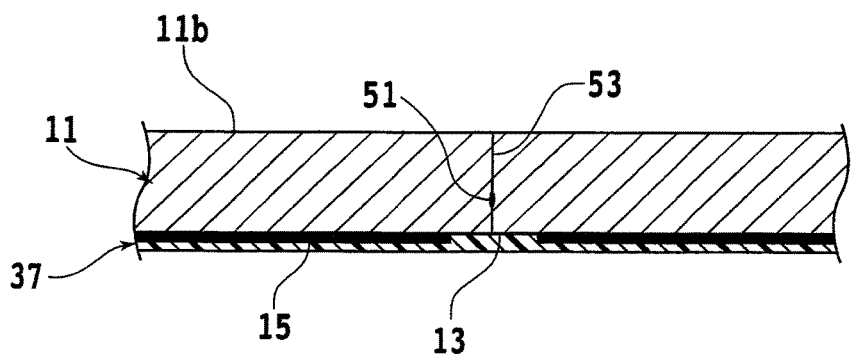
FIG. 11B is a sectional view illustrative of the dividing step according to Embodiment 3.

The wafer processing method according to the present embodiment begins with a dividing step to divide the wafer 11 by forming modified layers and cracks therein along the projected dicing lines 13. FIG. 11A is a fragmentary sectional side elevational view illustrative of the dividing step, and FIG. 11B is a sectional elevational view illustrative of the dividing step. The dividing step is performed using the laser processing apparatus 12 described above, for example. However, the laser oscillator, not shown, of the laser irradiation unit 16 is arranged to generate and emit a pulsed laser beam 49 having a wavelength that is to be transmitted through the wafer 11, i.e., a wavelength that is transmittable through the wafer 11 or a wavelength that is hard to be absorbed by the wafer 11. The laser irradiation unit 16 applies and focuses the pulsed laser beam 49 that is to be transmitted through the wafer 11 at predetermined positions.

In the dividing step, the dicing tape 37 that sticks to the face side 11a of the wafer 11 is held in contact with the holding surface of the chuck table 14, and a negative pressure from the suction source is caused to act on the dicing tape 37. At the same time, the frame 39 is secured to the chuck table 14 by the clamps. The wafer 11 is thus securely held on the chuck table 14 with the reverse side 11b being exposed upwardly. Then, the chuck table 14 is turned about its own axis to bring a target projected dicing line 13 into alignment with the processing-feed direction of the laser processing apparatus 12. The chuck table 14 is moved to position the laser irradiation unit 16 into alignment with an extension of the target projected dicing line 13, for example.

Then, as shown in FIG. 11A, while a pulsed laser beam 49 is being applied from the laser irradiation unit 16 to the reverse side 11b of the wafer 11, the chuck table 14 is moved in the processing-feed direction. The pulsed laser beam 49 is focused in the wafer 11, for example. Conditions in which the pulsed laser beam 49 is applied, i.e., the power level, spot diameter, repetitive frequency, etc. of the pulsed laser beam 49, are adjusted in such a range that the pulsed laser beam 49 can modify the inside of the wafer 11 by way of multiphoton absorption to form a modified layer 51 and a crack 53 in the wafer 11. In this fashion, a modified layer 51 is formed in the wafer 11 by the laser beam 49 that is applied thereto along the target projected dicing line 13, developing a crack 53 extending from the modified layer 51 to the face side 11a or the reverse side 11b, as shown in FIG. 11B, thereby dividing the wafer 11 along the target projected dicing line 13. The above process is repeated to divide the wafer 11 along all the projected dicing lines 13 into device chips corresponding to the respective devices 15, for example, whereupon the dividing step is finished. The modified layers 51 that have served as points where the wafer 11 starts being divided remain on the side surfaces of the device chips.

Figure 12:
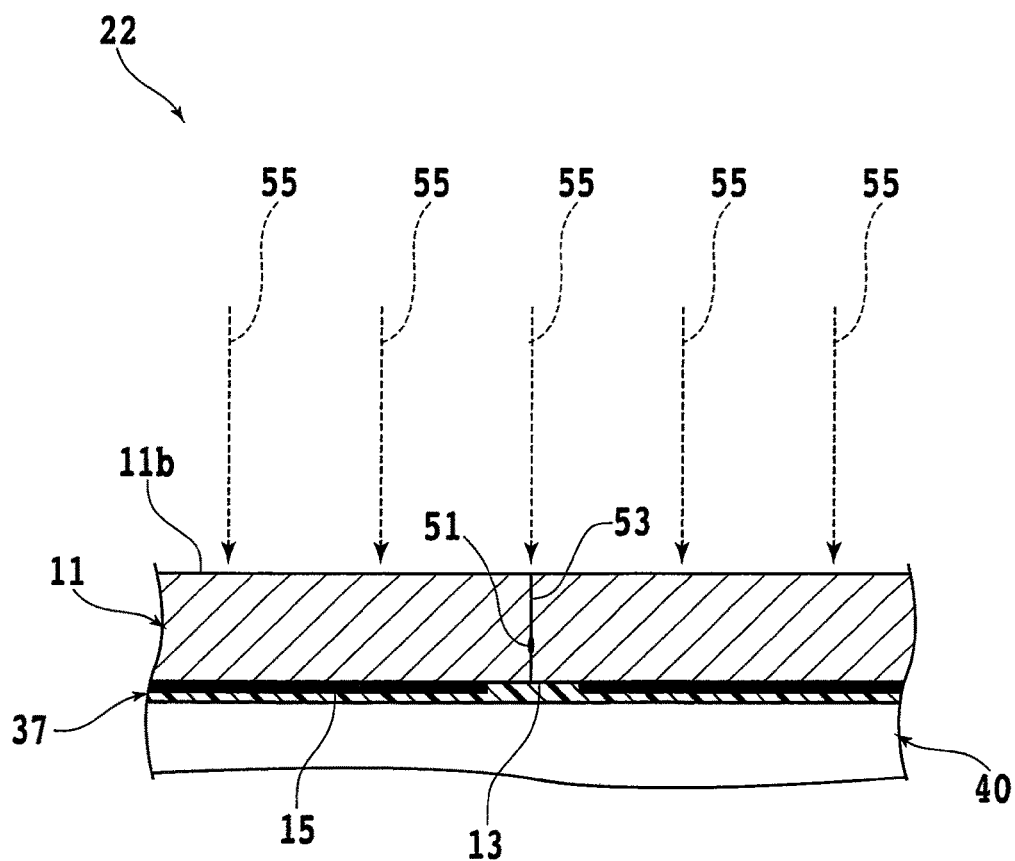
FIG. 12 is a fragmentary sectional side elevational view illustrative of a plasma etching step according to Embodiment 3.

The dividing step is followed by a plasma etching step to remove the modified layers 51 that remain on the device chips. FIG. 12 is a fragmentary sectional side elevational view illustrative of the plasma etching step. The plasma etching step according to the present embodiment is performed using the plasma etching apparatus 22 described above. Specific procedure details of the plasma etching step are the same as those of the plasma etching step according to Embodiment 2. In the plasma etching step according to the present embodiment, as shown in FIG. 12, a mixture gas or etching gas 55 that has been turned into a plasma state outside of the vacuum chamber 24 is delivered through the supply nozzle 52 into the vacuum chamber 24. Consequently, it is speculated that most of the highly reactive ions in the mixture gas 55 are lost before being introduced into the vacuum chamber 24, and radicals are more prevalent than ions within the processing space in the vacuum chamber 24. Therefore, the progress of etching by ions of the reverse side 11b of the wafer 11 is restrained, and the modified layers 51 that remain on the device chips can appropriately be removed without excessive etching progressing on the reverse side 11b (one surface) of the wafer 11.

Embodiment 4

A method of processing a wafer to divide the wafer by causing a cutting blade to cut into the wafer along the projected dicing lines will be described below. In the present embodiment, a wafer 11 which is identical to the wafer 11 according to Embodiment 2 is used. Stated otherwise, the dicing tape 37 sticks to the face side 11a of the wafer 11.

Figure 13:
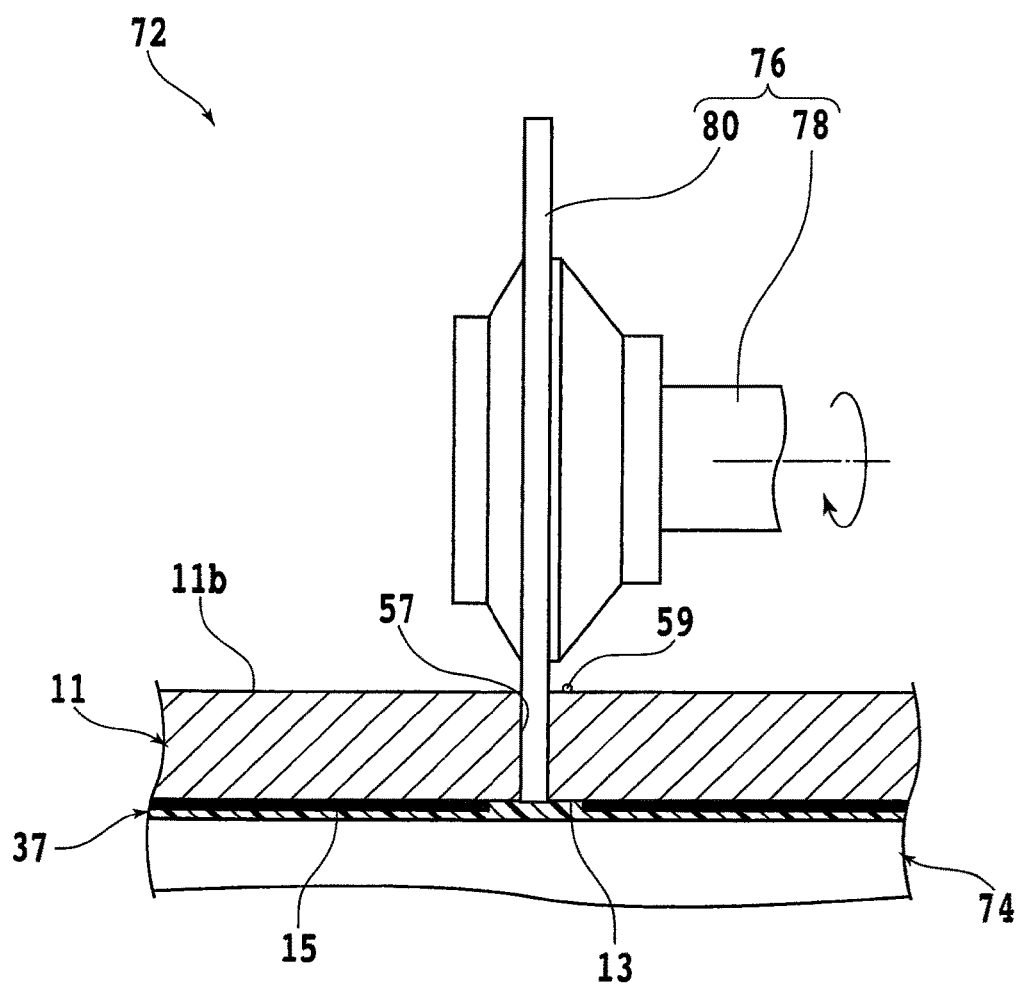
FIG. 13 is a fragmentary sectional side elevational view illustrative of a dividing step according to Embodiment 4.

The wafer processing method according to the present embodiment begins with a dividing step to divide the wafer 11 by causing a cutting blade to cut into the wafer 11 along the projected dicing lines 13, thereby dividing the wafer 11 along the projected dicing lines 13. FIG. 13 is a fragmentary sectional side elevational view illustrative of the dividing step. The dividing step is performed using the cutting apparatus 72 described above. In the dividing step, the dicing tape 37 that sticks to the face side 11a of the wafer 11 is held in contact with the holding surface of the chuck table 74, and a negative pressure from the suction source is caused to act on the dicing tape 37. At the same time, the frame 39 is secured to the chuck table 74 by the clamps. The wafer 11 is thus securely held on the chuck table 74 with the reverse side 11b being exposed upwardly. Then, the chuck table 74 is turned about its own axis to bring a target projected dicing line 13 into alignment with the processing-feed direction of the cutting apparatus 72. The chuck table 74 and the cutting unit 76 are moved relatively to each other to position the plane of the cutting blade 80 into alignment with an extension of the target projected dicing line 13. The lower end of the cutting blade 80 is moved to a vertical position lower than the face side 11a of the wafer 11.

Thereafter, while the cutting blade 80 is being rotated, the chuck table 74 is moved in the processing-feed direction. At the same time, the nozzle supplies a cutting fluid to the wafer 11 and the cutting blade 80. The cutting blade 80 cuts into the wafer 11 along the target projected dicing line 13, forming a kerf or slit 57 along which the wafer 11 is severed. The above process is repeated to form kerfs 57 in the wafer 11 along all the projected dicing lines 13, forming device chips corresponding to the respective devices 15, whereupon the dividing step is finished. In the dividing step, debris or processing chips 59 and processing strains, not shown, are produced in the kerfs 57 and nearby regions. In other words, the debris 59 and the processing strains remain on the device chips.

Figure 14:
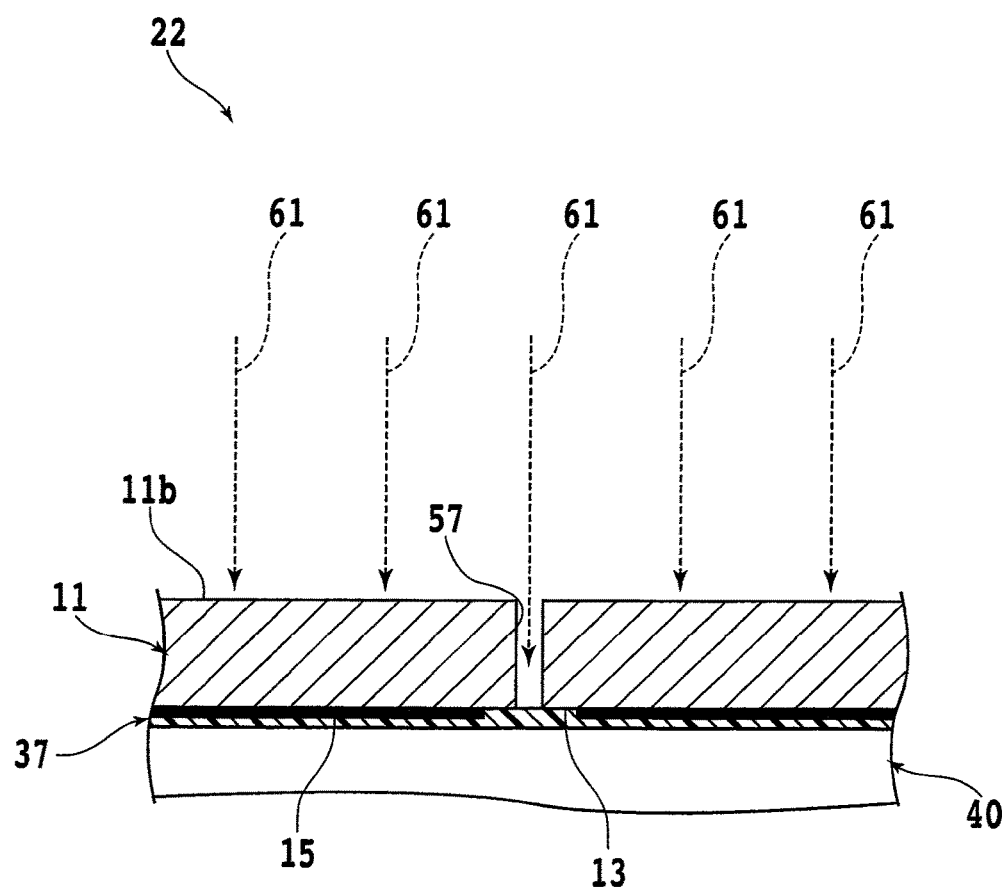
FIG. 14 is a fragmentary sectional side elevational view illustrative of a plasma etching step according to Embodiment 4.

The dividing step is followed by a plasma etching step to remove the debris 59 and processing strains that remain on each of the device chips. FIG. 14 is a fragmentary sectional side elevational view illustrative of the plasma etching step. The plasma etching step according to the present embodiment is performed using the plasma etching apparatus 22 described above. Specific procedure details of the plasma etching step are the same as those of the plasma etching step according to Embodiment 2. In the plasma etching step according to the present embodiment, as shown in FIG. 14, a mixture gas or etching gas 61 that has been turned into a plasma state outside of the vacuum chamber 24 is delivered through the supply nozzle 52 into the vacuum chamber 24. Consequently, it is speculated that most of the highly reactive ions in the mixture gas 61 are lost before being introduced into the vacuum chamber 24, and radicals are more prevalent than ions within the processing space in the vacuum chamber 24. Therefore, the progress of etching by ions of the reverse side 11b of the wafer 11 is restrained, and the debris 59 and processing strains that remain on the device chips can appropriately be removed without excessive etching progressing on the reverse side 11b (one surface) of the wafer 11.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of processing a wafer on which devices are formed in a plurality of areas demarcated on a face side thereof by a plurality of projected dicing lines arranged in a grid pattern, the method comprising:
    a protective film applying step of applying a protective film to the face side of said wafer;
    a processed groove forming step of forming processed grooves in said wafer from the face side thereof along said projected dicing lines;
    a plasma etching step of supplying an etching gas in a plasma state to said wafer from the face side thereof to remove processing strains or debris remaining in the processed grooves; and
    a protective film removing step of removing said protective film from said wafer,
    wherein the plasma etching step includes
        turning an etching gas into a plasma state outside of a vacuum chamber which houses said wafer therein, and
        delivering the etching gas in the plasma state into said vacuum chamber through a supply nozzle connected to said vacuum chamber.

2. The method of processing a wafer according to claim 1,
    wherein said processed groove forming step includes applying a laser beam having a wavelength that is absorbable by said wafer to said wafer to form processed grooves in said wafer.

3. The method of processing a wafer according to claim 1,
    wherein said processed groove forming step includes causing a cutting blade to cut into said wafer to form processed grooves in said wafer.

4. A method of processing a wafer on which devices are formed in a plurality of areas demarcated on a face side thereof by a plurality of projected dicing lines arranged in a grid pattern, the method comprising:
    a cut groove forming step of causing a cutting blade to cut into said wafer from a reverse side thereof along said projected dicing lines to form cut grooves in said wafer to a depth short of the face side of said wafer;
    a dividing step of applying a laser beam to the bottoms of said cut grooves from the reverse side of said wafer to divide the wafer into device chips corresponding to said respective devices; and
    a plasma etching step of supplying an etching gas in a plasma state to said wafer from the reverse side thereof to remove processing strains or debris remaining on said device chips,
    wherein the plasma etching step includes
        turning an etching gas into a plasma state outside of a vacuum chamber which houses said wafer therein, and
        delivering the etching gas in the plasma state into said vacuum chamber through a supply nozzle connected to said vacuum chamber.

5. A method of processing a wafer on which devices are formed in a plurality of areas demarcated on a face side thereof by a plurality of projected dicing lines arranged in a grid pattern, the method comprising:
    a dividing step of applying a laser beam having a wavelength that is transmittable through said wafer to said wafer from a reverse side thereof along said projected dicing lines while focusing said laser beam at positions in said wafer, thereby forming modified layers in said wafer and developing cracks extending from said modified layers to the face side or the reverse side of said wafer, whereby said wafer is divided into device chips corresponding to said respective devices; and
    a plasma etching step of supplying an etching gas in a plasma state to said wafer from the reverse side thereof to remove the modified layers remaining on said device chips,
    wherein the plasma etching step includes
        turning an etching gas into a plasma state outside of a vacuum chamber which houses said wafer therein, and
        delivering the etching gas in the plasma state into said vacuum chamber through a supply nozzle connected to said vacuum chamber.

6. A method of processing a wafer on which devices are formed in a plurality of areas demarcated on a face side thereof by a plurality of projected dicing lines arranged in a grid pattern, the method comprising:
    a dividing step of causing a cutting blade to cut into said wafer from a reverse side thereof along said projected dicing lines to divide said wafer into device chips corresponding to said respective devices; and
    a plasma etching step of supplying an etching gas in a plasma state to said wafer from the reverse side thereof to remove processing strains or debris remaining on said device chips, wherein the plasma etching step includes
turning an etching gas into a plasma state outside of a vacuum chamber which houses said wafer therein, and
delivering the etching gas in the plasma state into said vacuum chamber through a supply nozzle connected to said vacuum chamber.

* * * * *